United States Patent
Terashima

(10) Patent No.: US 8,980,533 B2
(45) Date of Patent: Mar. 17, 2015

(54) SUPPLY APPARATUS WHICH SUPPLIES RADICALS, LITHOGRAPHY APPARATUS, AND METHOD OF MANUFACTURING ARTICLE

(71) Applicant: Canon Kabushiki Kaisha, Tokyo (JP)

(72) Inventor: Shigeru Terashima, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 14/036,507

(22) Filed: Sep. 25, 2013

(65) Prior Publication Data

US 2014/0113235 A1 Apr. 24, 2014

(30) Foreign Application Priority Data

Oct. 22, 2012 (JP) .................................. 2012-233305

(51) Int. Cl.
*G03F 7/20* (2006.01)
(52) U.S. Cl.
CPC ........................................ *G03F 7/20* (2013.01)
USPC ........................... 430/322; 250/432 R; 355/67
(58) Field of Classification Search
USPC ........................... 430/322; 250/432 R; 355/67
See application file for complete search history.

(56) References Cited

U.S. PATENT DOCUMENTS

| | | | |
|---|---|---|---|
| 6,383,896 B1 * | 5/2002 | Kirimura et al. | 438/478 |
| 7,315,346 B2 | 1/2008 | Van Beek et al. | |
| 2005/0175789 A1 * | 8/2005 | Helms, Jr. et al. | 427/457 |
| 2007/0062645 A1 * | 3/2007 | Fukuchi | 156/345.24 |

FOREIGN PATENT DOCUMENTS

| | | |
|---|---|---|
| JP | 05-271951 A | 10/1993 |
| JP | 2004-200686 A | 7/2004 |
| JP | 2005244015 A | 9/2005 |
| JP | 2007281321 A | 10/2007 |

OTHER PUBLICATIONS

English Machine Translation, Kenji, JP 05-271951, Oct. 19, 1993.*

* cited by examiner

*Primary Examiner* — Caleen Sullivan
(74) *Attorney, Agent, or Firm* — Rossi, Kimms & McDowell LLP

(57) ABSTRACT

A supply apparatus for supplying radicals includes: a generator arranged in a chamber and configured to generate radicals by activating a gas supplied into the chamber; and a transport pipe having one end connected to the chamber and the other end from which the generated radicals are discharged. The generator is configured to activate the gas with infrared light radiation accompanied. An inner surface of the transport pipe is formed into a patterned shape by which the infrared light exiting the other end is less than the infrared light entering the one end.

9 Claims, 6 Drawing Sheets

F I G. 2
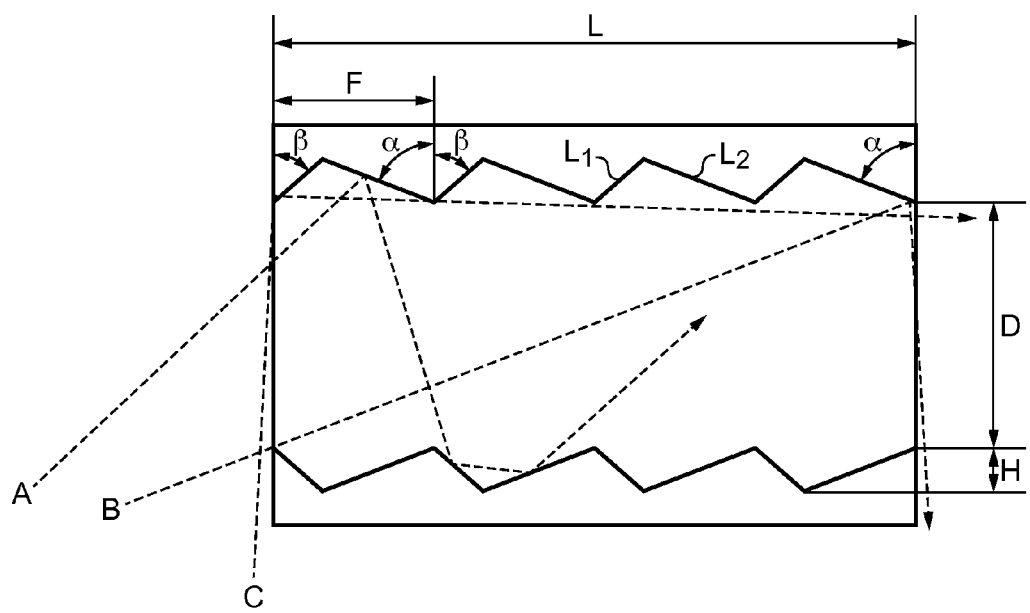

F I G. 3
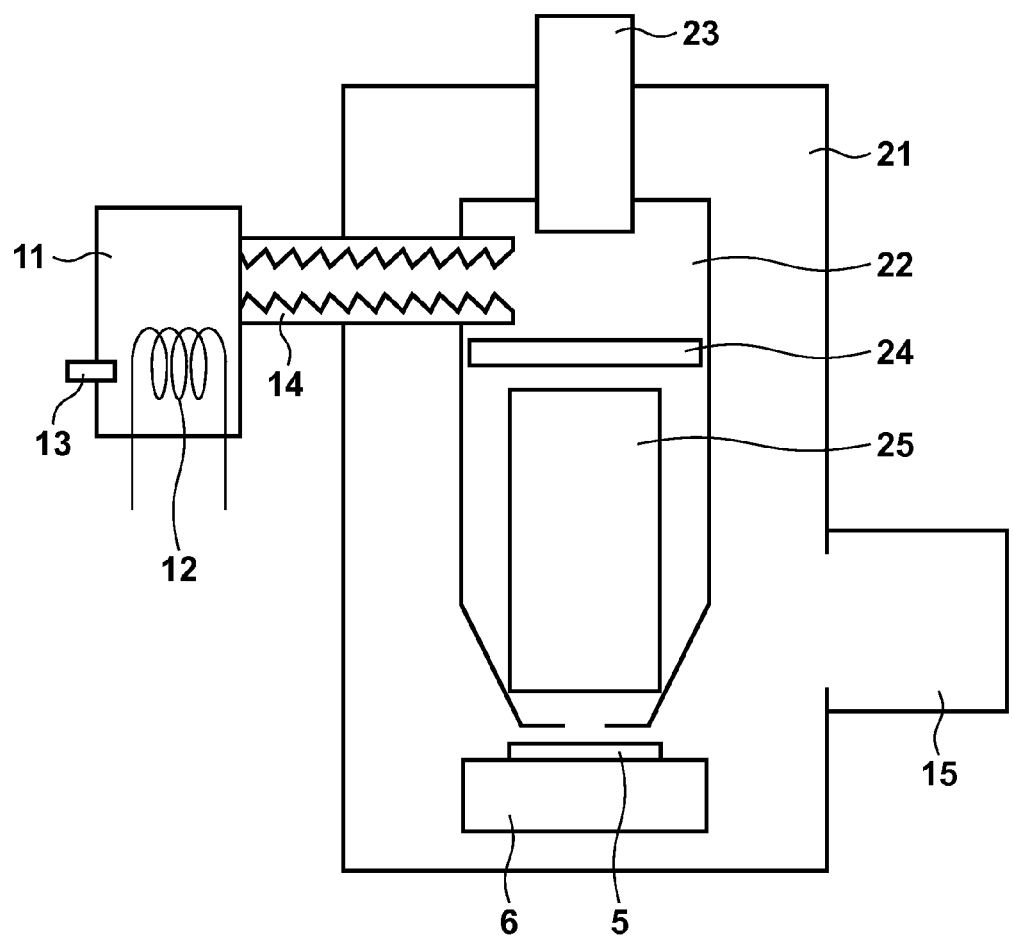

SUPPLY APPARATUS WHICH SUPPLIES RADICALS, LITHOGRAPHY APPARATUS, AND METHOD OF MANUFACTURING ARTICLE

BACKGROUND OF THE INVENTION

1. Field of the Invention

The present invention relates to a supply apparatus which supplies radicals, a lithography apparatus, and a method of manufacturing an article.

2. Description of the Related Art

Conventionally, a projection exposure method using ultraviolet light as an energy beam has been practiced as one of the lithography methods for manufacturing fine semiconductor devices such as semiconductor memories and logic circuits. With increases in the integration of semiconductor devices, however, demands have arisen for the establishment of a lithography technique of obtaining a resolution of 35 nm or less, which cannot be achieved by lithography methods using ultraviolet light of conventional wavelengths. The resolution in projection exposure is proportional to the wavelength of light used for exposure. For this reason, as one of the methods for efficient exposure of very fine circuit patterns described above, a lithography technique has been developed, which uses EUV (Extreme Ultraviolet) light having a wavelength of 5 to 20 nm shorter than conventional ultraviolet light as an energy beam.

In the EUV region, almost all substances have strong absorbance, and hence it is almost impossible to use transmission type optical elements using refraction as in lithography using conventional ultraviolet light as exposure light. An EUV exposure apparatus therefore uses reflection type optical elements such as mirrors for an energy beam irradiation system to control an energy beam. A multilayer film having two or more types of layers with different optical constants stacked on each other is formed on a surface of an optical element. As an optical element, for example, an element obtained by alternately stacking molybdenum and silicon layers on the surface of a glass substrate which is polished into a precise shape is known. In addition, attention has conventionally been given to a lithography technique of directly drawing a fine circuit pattern on a semiconductor substrate by using a charged particle beam as an energy beam.

EUV light is also absorbed by gas components existing in the atmosphere and is considerably attenuated. For this reason, the inside of an exposure apparatus is held in a vacuum high enough to prevent exposure light from being attenuated. In a lithography apparatus using an electron beam, an electron beam generation source and a beam path are also held in a vacuum. Small amounts of gases containing carbon compounds and water as main components remain in a vacuum atmosphere in the lithography apparatus. These residual gases are generated from components, cables, organic material components, and the like used inside the exposure apparatus. Volatile gases are also generated from the photosensitizing agent (to be referred to as a resist hereinafter) applied on a wafer.

A residual gas is repeatedly adsorbed and desorbed on and from the surface of an optical element used in the exposure apparatus. However, physical adsorption alone hardly cause adsorption or reaction on the optical element surface. When, however, the optical element is irradiated with EUV light, secondary electrons generated on the optical element surface cause a physically adsorbed gas to dissociate. A product due to the dissociation is sometimes deposited on the optical element surface or a generated reactive species sometimes modifies the optical element surface. They are called contaminations. Such contaminations mainly include the following two phenomena. One phenomenon is that components of residual gases which contain carbon are physically adsorbed on the optical element surface, are dissociated from the surface when irradiated with EUV light, and carbon or compounds containing it are deposited on the optical element surface. The other phenomenon is that water components adsorbed on the optical element surface are dissociated, when irradiated with EUV light in the same manner, to generate active oxygen and oxidize the optical element surface.

When carbon or a compound containing it is deposited in an amount exceeding a given amount on the optical element surface or the optical element surface is oxidized, the performance of the optical element deteriorates, resulting in a deterioration in the performance of the exposure apparatus. In an EUV exposure apparatus, in particular, if an optical element is a reflection type multilayer film mirror, even the deposition of merely several nm of a carbon compound per mirror or the oxidation of the uppermost layer to a thickness of merely several nm leads to a decrease in reflectance which considerably affects the throughput. Attempts have been made to prevent surface oxidation among these contaminations by providing an oxidation-resistant film. On the other hand, it is thought that the deposition of carbon or the like cannot be avoided to a certain degree, and hence attempts have been made to remove the deposited carbon or carbon compound.

Several methods of removing carbon deposited on an optical element have been proposed. For example, Japanese Patent Laid-Open No. 2005-244015 discloses a method of separately arranging a light source for cleaning and causing, at the time of stopping exposure, the light source for cleaning to apply light onto the same optical path as that used for exposure. This method also provides a gas supply system and performs optical cleaning while introducing an oxidizing gas such as oxygen or ozone, hydrogen, water, and the like. Introducing these gases will make a compound containing carbon react with the gases and facilitate removing the compound. Japanese Patent Laid-Open No. 2004-200686 has proposed a method of removing a carbon deposit on a multilayer film mirror by generating active atomic hydrogen (hydrogen radicals) and introducing it onto the surface of an optical element. Japanese Patent Laid-Open No. 2007-281321 has proposed a method of removing an oxide film or carbon deposition on an optical element surface by irradiating the optical element surface with exposure light while introducing a reducing gas.

Of these methods, the method using hydrogen radicals is expected as a promising method because a hydrogen radical has the ability to remove a carbon deposit and the ability to reduce a oxidized mirror surface. FIG. 4 shows an example of an arrangement for contamination removal using hydrogen radicals in an EUV exposure apparatus. In order to generate hydrogen radicals, a current is supplied to a filament 12 as an activation source to heat it to about 1,500° C. or higher, and hydrogen gas is introduced from an introduction port 13. At this time, an exhaust system 15 of the exposure apparatus performs exhausting operation. In this case, the hydrogen radicals generated in a chamber 11 pass through a transport pipe 14 and flow into a housing (or frame) 10 which holds (accommodates) mirrors installed in the exposure apparatus. The inflowing hydrogen radicals react with the carbon contamination deposited on the surfaces of mirrors 7, 8, and 9 to generate hydrocarbon gas, which is then exhausted from the exhaust system 15. This removes the carbon contamination from the mirrors 7, 8, and 9 and recovers the reflectance of the mirrors.

Since the filament 12 which generates hydrogen radicals is heated to 1,500° C. or higher as described above, if the filament 12 is directly installed in the exposure apparatus, the filament 12 applies radiation heat to the mirrors 7, 8, and 9 and the housing 10. This will disturb the optical system including the mirrors 7, 8, and 9 whose positions have been accurately adjusted. In order to avoid this, for example, as shown in FIG. 4, the chamber 11 accommodating the filament 12 is installed outside a vacuum chamber 1 accommodating the exposure apparatus to introduce generated radicals into the exposure apparatus through the transport pipe 14. Although not shown in the accompanying drawings, a vessel forming the chamber 11 can be temperature-controlled by water cooling or the like to avoid influences of heat conduction and the like.

As described above, since the filament 12 serves as a heat source, it is necessary to thermally detach it from the optical elements and other components as far as possible. The transport pipe 14 therefore needs to be long. It has been conventionally pointed out that hydrogen radicals lose their activity when they come into contact with other solids such as the wall of the chamber 11 surrounding the filament 12, the inner wall of the transport pipe 14, the surfaces of optical elements, and the components of the apparatus. For this reason, the transport pipe 14 is required to be thick and short as much as possible. According to Japanese Patent Laid-Open No. 5-271951, in order to reduce the deactivation of radicals, it is necessary to further reduce the surface roughness of the inner surface of the radical transport portion.

However, making the transport pipe 14 for radicals have a smooth inner surface will raise another problem. Using, for example, tungsten for the filament 12 to generate radicals makes the filament 12 serve as a light source at the same time when its temperature rises. The filament 12 generates light having wavelengths from visible light wavelengths to infrared wavelengths, and emits the light in all directions. The light partly enters the inner surface of the transport pipe 14 as shown in FIG. 4. Since the transport pipe 14 is a cylindrical or square pipe, light enters the inner surface at large incident angles. In general, as the incident angle increases, the reflectance at the surface tends to increase. In addition, if the number of times of reflection on the inner surface of the transport pipe remains small, the light leaks out from the transport pipe 14.

The light exiting from the transport pipe 14 at high reflectance and with a small number of times of reflection is applied on optical elements directly or on the housing (for example, the lens barrel) holding the optical elements. When an object is irradiated with light including infrared light (infrared rays) generated by the filament 12, the temperature of the irradiated portion rises to cause thermal expansion. If this object is an optical element, its shape partly changes even though the change is small. If the shape of the object restores until the resumption of exposure, the changed shape influences the orbit of exposure light, resulting in a deterioration in exposure performance. As indicated by reference numerals 17 and 18 in FIG. 4, when unnecessary light is applied in the exposure apparatus, its shape partly distorts to influence the positional relationship between optical elements. When the mirror 7 or the housing 10 is irradiated with infrared light from the filament 12 and the reflecting surface of the mirror 7 changes, the apparatus performs exposure through an optical path 19 shifted from an optical path 16 through which the apparatus should perform exposure, resulting in a deterioration in exposure performance.

Similar problems arise in a charged particle beam (electron beam) drawing apparatus even when a radical generator and a radical transport pipe are installed to remove or reduce contamination on elements constituting a charged particle (electronic) optical system. The infrared light generated from the filament of the radical generator is reflected by the inner surface of the transport pipe and reaches an element of an optical system or the housing holding the element. The portion which the light has reached absorbs the light and then slightly thermally expands. As a result, the shape or position of the element shifts from the design value, and hence the orbit of a charged particle beam for drawing can slightly change. This leads to a deterioration in drawing performance.

SUMMARY OF THE INVENTION

The present invention provides, for example, a supply apparatus, which supplies radicals, advantageous in mitigation of an adverse effect of infrared light.

The present invention provides a supply apparatus for supplying radicals, the apparatus comprising: a generator arranged in a chamber and configured to generate radicals by activating a gas supplied into the chamber; and a transport pipe having one end connected to the chamber and the other end from which the generated radicals are discharged, wherein the generator is configured to activate the gas with infrared light radiation accompanied, and an inner surface of the transport pipe is formed into a patterned shape by which the infrared light exiting the other end is less than the infrared light entering the one end.

Further features of the present invention will become apparent from the following description of exemplary embodiments with reference to the attached drawings.

BRIEF DESCRIPTION OF THE DRAWINGS

FIG. 2 is a sectional view of a transport pipe;

FIG. 3 is a schematic view showing the arrangement of a charged particle beam drawing apparatus according to the second embodiment;

DESCRIPTION OF THE EMBODIMENTS

A supply apparatus which supplies radicals according to the present invention and a lithography apparatus which includes the supply apparatus and forms a pattern on a substrate with an energy beam will be described below.

First Embodiment

Figure 1:
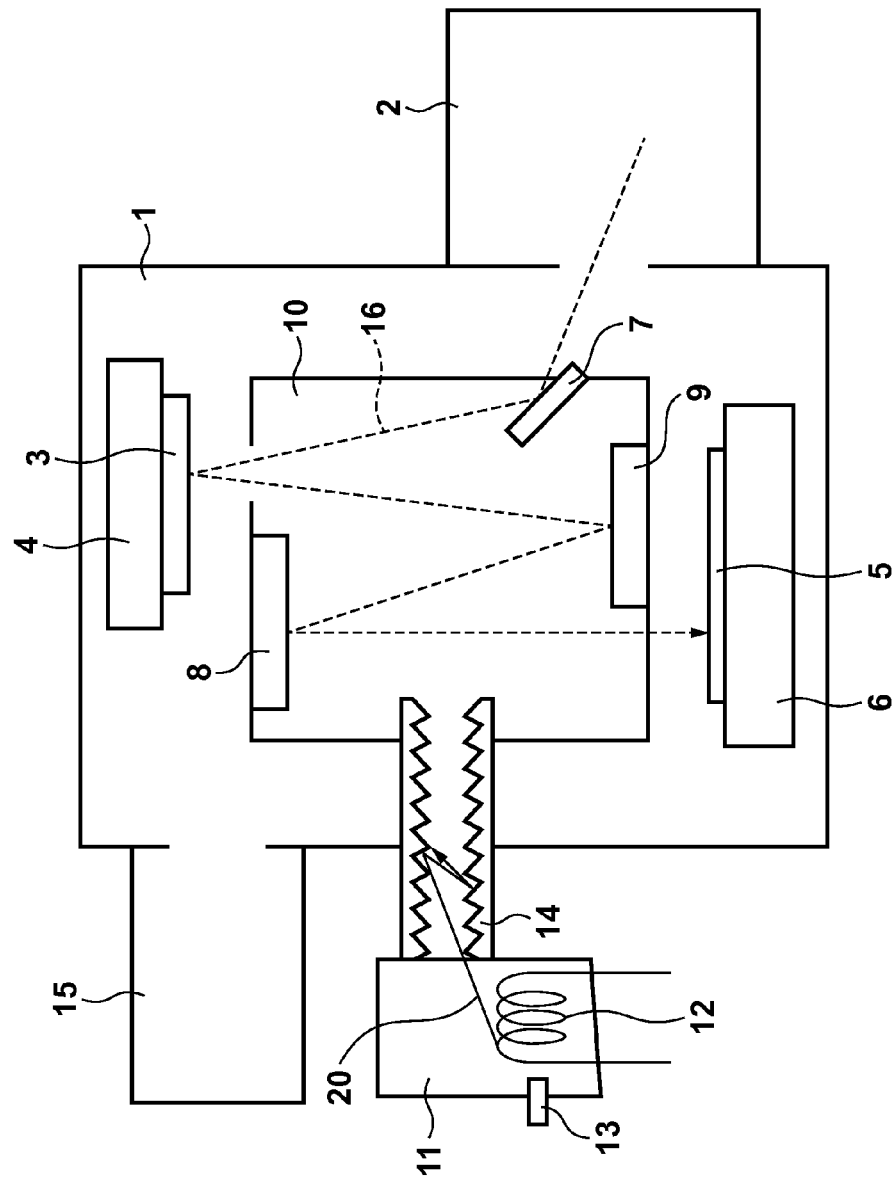
FIG. 1 is a schematic view showing the arrangement of an EUV exposure apparatus according to the first embodiment.
Figure 4:
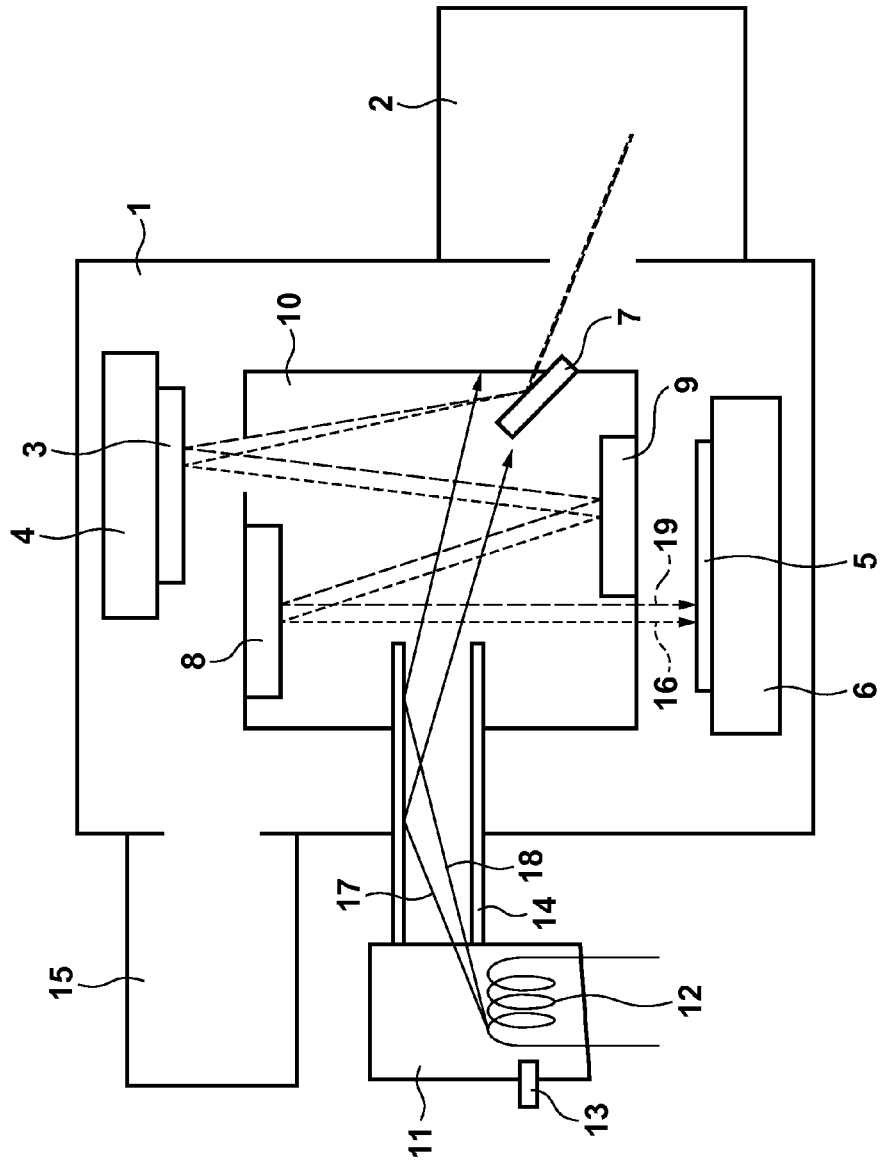
FIG. 4 is a view for explaining problems in the prior art.

FIG. 1 shows an example of an EUV exposure apparatus configured to remove contamination adhering to mirrors of a projection optical system by using radicals. The EUV exposure apparatus uses EUV light as an energy beam. This apparatus uses optical elements constituting an illumination system and a projection optical system (energy beam irradiation system) as elements for controlling an energy beam. Although there are other elements constituting the exposure apparatus, since they are not specifically required to explain the present invention, a description of them will be omitted. The first embodiment uses a phenomenon in which when a current is supplied to a tungsten filament to generate heat and hydrogen molecules come into contact with the high-temperature tungsten filament upon introduction of hydrogen gas, the molecules are dissociated into hydrogen radicals (atomic hydrogen).

A vacuum chamber 1 maintains the projection optical system of the EUV exposure apparatus in a vacuum. A vacuum chamber 2 accommodates a light source for EUV light and an illumination optical system. In the vacuum chamber 1, an original plate (reticle) 3, an original plate state 4, a substrate (wafer) 5, a wafer stage 6, mirrors (optical elements) 7 to 9 which reflect EUV light, and an exhaust system 15. A housing (lens barrel) 10 holds the optical elements (mirrors) 7 to 9. The supply apparatus which supplies hydrogen radicals includes a chamber 11 and a radical transport pipe (transport pipe) 14 having one end connected to the chamber 11 and other end from which the radicals generated in the chamber 11 are discharged into the exposure apparatus. In the chamber 11, a filament (generator) 12 and a hydrogen gas introduction port 13 are arranged. The filament 12 generates radicals (hydrogen radicals) by activating hydrogen gas (gas). The introduction port 13 supplies hydrogen gas into the chamber.

When activating hydrogen gas in the above manner, the filament 12 is heated to a high temperature of 1,500° C. or higher and hence accompanies the radiation of infrared light. A dotted line 16 indicates an EUV optical path. A solid line 20 indicates an example of the orbit of infrared light generated from the filament 12. If therefore the filament 12 is installed in the exposure apparatus, the filament 12 applies radiation heat to the mirrors 7, 8, and 9 and the housing 10 holding the mirrors. This will disturb the projection optical system whose position is accurately adjusted. In order to prevent this, the first embodiment installs the chamber 11 accommodating the filament 12 outside the vacuum chamber 2 accommodating the exposure apparatus and introduces radicals into the exposure apparatus through the transport pipe 14. The filament 12 is arranged at the position of the chamber 11 which prevents the light emitted from the filament 12 from being directly applied to the housing 10 to which radicals are to be supplied. That is, the inner wall of the transport pipe 14 or the wall of the chamber 11 partly exists on a straight line connecting the filament 12 to the housing 10 as a member which prevents light from being directly applied to the housing 10. This makes it difficult for the light generated by the filament 12 to enter the exposure apparatus. Although not shown in FIG. 1, the temperature of the chamber 11 is controlled by water cooling to avoid the influences of heat conduction and the like.

A specific use of the supply apparatus for the exposure apparatus will be described below. When performing general exposure, the housing 10 of the projection optical system is maintained in a high vacuum of, for example, about $1 \times 10^{-5}$ Pa. Note however that a very small amount of residual gas exists in such a high vacuum state, and a very small amount of organic substance is diffused from the resist applied on a wafer surface in the apparatus at the time of exposure on the wafer 5. For this reason, irradiating the surfaces of the optical elements 7 to 9 constituting the projection optical system with EUV light will cause photochemical reaction of the organic substance. As a result, the substance adheres as a carbon contamination to the surfaces. Repeating exposure will increase the amount of carbon contamination adhering to the surfaces and deposit the contamination in the exposure apparatus.

If the carbon contamination is deposited to a thickness of, for example, about 2 nm, the reflectance of the mirrors 7 to 9 constituting the projection optical system decreases by about 1%. Since ten several mirrors including the mirrors 7 to 9 constitute the projection optical system, if, for example, the reflectance decreases by 1% per mirror, the reflectance of the overall projection optical system decreases by 10% or more, resulting in a considerable deterioration in use efficiency. In order to grasp such a phenomenon, the exposure apparatus sometimes measures the position of the wafer 5 or the position of the reticle 3 or measures illuminance at a preset position by using an illuminometer (not shown). If an illuminance measurement result indicates that, for example, the illuminance has decreased by 10% as compared with the initial illuminance (the illuminance at the time of shipment of the exposure apparatus), the apparatus switches over to the mode of removing contamination from each mirror surface. Each semiconductor maker which uses an exposure apparatus sets a value indicating the amount of reduction in contamination in consideration of efficiency. That is, it is not always necessary to perform removing operation with a reduction ratio of 10% or less.

Carbon contamination is removed in accordance with the following steps. First of all, the operator stops the general exposure step and recovers the reticle 3 and the wafer 5. This operation is required to stop driving the reticle state 4 and the wafer stage 6. In addition, the operator separates any space including optical systems which need not be cleaned, such as a light source portion for exposure, as much as possible by using a gate valve or the like (not shown). This completes preparations for the removal step on the apparatus side.

The operator then starts preparing for generating hydrogen radicals and supplying them into the exposure apparatus. In order to supply hydrogen radicals to the optical elements 7 to 9 as cleaning targets as much as possible, the transport pipe 14 may be introduced into the exposure optical path as needed. Hydrogen gas is supplied from the introduction port 13 into the chamber 11. At this time, the exhaust capacity of the exhaust system 15 of the exposure apparatus is decreased lower than the original capacity to adjust the supply amount of hydrogen gas to prevent excessive supply. For example, there is available a method of reducing the exhaust conductance by closing the main exhaust path and performing exhaust through a bypass exhaust path (not shown). Although an exhaust rate of about 3,000 L/sec is maintained in the general exposure step, this rate is reduced to about 1/100 at this time. In this case, the pressure in the lens barrel space of the exposure apparatus is set to 15 Pa. Obviously, a pressure higher or lower than the above pressure may be set. A suitable pressure range is from 0.1 Pa to 100 Pa.

After starting to supply hydrogen gas, the apparatus supplies a current to the filament 12 to raise its temperature. The apparatus controls the current to be supplied so as to set the temperature of the filament 12 to 1,800° C. At this time, the apparatus monitors the voltage applied to the filament 12 and estimates the temperature of the filament 12 by calculating the resistance value of the filament 12. Obviously, the apparatus may use a method of monitoring the temperature of the filament 12 by using the light generated from the filament 12. As the temperature of the filament 12, it is possible to select a proper temperature in the range from 1,400° C. to 2,200° C. or set a temperature from the target amount of carbon contamination to be removed in each case. There is an almost correlation between the temperature of the filament 12 and the amount of radicals generated. For this reason, if it is necessary to generate many radicals, the temperature of the filament 12 is set to a relatively high temperature. Note however that setting the temperature of the filament 12 too high may cause the filament material to start to evaporate and decrease the durability of the filament 12. Therefore, a temperature at which the evaporation rate is a predetermined value or less can be set.

The hydrogen radicals generated in the chamber 11 pass through the transport pipe 14 and are supplied into the housing accommodating the optical elements 7 to 9 in the exposure apparatus. When the hydrogen radicals reach the mirror surfaces, the radicals combine with the carbon contamination deposited on the mirror surfaces and are discharged into the space as hydrocarbon gas. The exhaust system 15 exhausts such a gas outside the exposure apparatus.

Upon completing the removal of the deposited carbon contamination, the apparatus stops supplying a current to the filament 12. Stopping supplying a current to the filament 12 will immediately decrease the temperature of the filament 12. When the temperature of the filament 12 decreases to 1,000° C. or lower, almost no hydrogen radicals are generated. In order to quickly decrease the temperature of the filament 12, the apparatus stops introducing hydrogen gas with a slight delay. The duration of this delay may be about several ten sec to several min. Subsequently, the apparatus stops supplying hydrogen gas to restore the exhaust capacity of the exhaust system 15 of the exposure apparatus to the normal capacity, and waits until the pressure in the exposure apparatus decreases. In addition, the apparatus concurrently retracts the transport pipe 14 inserted in the exposure path from the optical path. Although the use of hydrogen makes it slightly difficult to decrease the pressure in the exposure apparatus, since hydrogen has low absorbance of EUV light, the apparatus may start preparing exposure when the pressure becomes about $1 \times 10^{-2}$ Pa or lower. The apparatus starts preparations for exposure, for example, being connected to the exposure light source to introduce exposure light into the apparatus to perform illuminance measurement or the like and check the effect of removal of carbon contamination. Upon completing these preparations and setting the pressure in the exposure apparatus to the normal exposure pressure, the operator transfers the wafer 5 and makes the apparatus resume exposure.

The transport pipe 14 used in the first embodiment will be described in more detail with reference to FIG. 2. FIG. 2 is a sectional view of the transport pipe 14 having a cylindrical shape. The inner wall surface is processed into a corrugated shape (indented shape) so as to reduce the intensity of light generated by the filament 12 and discharged from the transport pipe 14. The transport pipe 14 has a length L, an inner diameter D, a corrugation height H, and a period length F of the corrugations. A cross-section of the inner wall of the transport pipe 14 cut along a plane including a central axis extending from one end to the other end of the transport pipe 14 includes pairs of first line segments L1 and second line segments L2 which are inclined to the central axis. The first line segment L1 and the second line segment L2 are configured such that a normal to the first line segment L1 crosses a normal to the second line segment L2. More specifically, as shown in FIG. 2, the first line segment L1 and the second line segment L2 are configured to have inclination angles $\alpha$ and $\beta$, respectively. Dotted lines A, B, and C in FIG. 2 respectively indicate light beams including infrared rays generated by the filament 12.

The inner wall surface of the transport pipe 14 in the first embodiment is structured such that light entering and coming into contact with the inner wall surface of the transport pipe 14 is not discharged into the exposure apparatus without being reflected by the inner wall surface of the transport pipe 14 twice or more. The light beam B almost diagonally enters the transport pipe 14 and comes into contact with the corrugated surface on the lowermost stream side. If the angle $\alpha$ of each corrugation satisfies mathematical expression (1) given below, a light beam can pass through the transport pipe 14 upon one reflection like the light beam B in FIG. 2.

$$\alpha > \pi/4 + (\tan^{-1}(D/(L-F)))/2 \quad (1)$$

In addition, since L>>F, $(\tan^{-1}(D/(L-F)))$ is almost equal to $(\tan^{-1}(D/L))$. Therefore, mathematical expression (1) can be substituted by mathematical expression (2).

$$\alpha > \pi/4 + (\tan^{-1}(D/(L)))/2 \quad (2)$$

Setting $\alpha$, D, and L to satisfy mathematical expression (3) will inhibit light from passing through the transport pipe 14 upon one reflection even when the light enters the inner wall of the transport pipe 14 at a small angle like the light beam B.

$$\alpha < \pi/4 + (\tan^{-1}(D/(L)))/2 \quad (3)$$

The light beam C almost perpendicularly enters the transport pipe 14. In this case, setting $\beta$ to satisfy mathematical expression (4) given below will inhibit a light beam from passing through the transport pipe 14 upon one reflection.

$$\beta < \pi/4 \quad (4)$$

Specific examples of numerical values are set such that the length L of the transport pipe 14 is 300 mm, the inner diameter D is 30 mm, the corrugation height H is 2 mm, and the corrugation angles $\alpha$ and $\beta$ are 60° and 40°, respectively. Assume that the transport pipe 14 is configured to have such settings. In this case, the light generated by the filament 12 enters the transport pipe 14 like, for example, the light beam A, and is repeatedly reflected within the pipe due to a corrugating process inside the pipe as shown in FIG. 2. As a result, when the light generated by the filament 12 passes through the outlet of the transport pipe 14, the intensity of the light is greatly attenuated as compared with when it has entered the transport pipe 14. In addition, a small change in incident angle leads to a large change in exit direction. Even if, therefore, light is reflected by the inner surface of the transport pipe 14 a plurality of number of times and passes through the transport pipe 14 to reach the exposure apparatus, the light has almost no such influence as to raise the temperature in the projection optical system because the light has been attenuated and scattered.

The above specific numerical values concerning the transport pipe 14 are merely examples and are not limited to them. The proper corrugation height H is from the length equal to the period length F to about half the length. In order to reflect infrared light by the corrugated wall surface, which is intended by the present invention, the surface width along which a corrugated shape is formed needs to be longer than the wavelength of infrared light. The longest wavelength of infrared light is about 1 mm. If the corrugation height H is 1 mm or more which is equal to the maximum wavelength of infrared light, the corrugation width exceeds 1 mm regardless of the corrugation angle. Although any specific threshold cannot be set for the corrugation height H, the height H should be sufficiently smaller than the pipe diameter because too small actual pipe diameter due to the corrugated shape will cause a trouble in the transportation of radicals. The corrugation height H can be ⅕ or less of the pipe diameter.

The inner surface shape of the transport pipe 14 is not limited to that described above. The smaller the surface area, the smaller the deactivation of radicals. For example, a large corrugated shape may be formed near the inlet of the chamber 11, and a small corrugated shape may be formed near the outlet. In addition, since the effect of one corrugation is smaller, it is necessary to form a plurality of corrugations. Although a corrugated shape in the pipe can be continuously formed as in the first embodiment, it is not an essential condition. In this case, corrugations can be provided at at least three portions, namely the inlet, outlet, and intermediate portion of the transport pipe 14.

The number of supply apparatuses each constituted by the chamber 11 accommodating the filament 12 and the transport pipe 14 is not limited to one for the exposure apparatus. Since many optical elements including the optical elements 7 to 9 are required and the reach range of radicals is limited to a certain degree, one supply apparatus is required for several optical elements. For example, an EUV exposure apparatus requires three supply apparatuses for the illumination optical system and two supply apparatuses for the projection optical system.

Second Embodiment

FIG. 3 shows the second embodiment using a supply apparatus for a charged particle beam drawing apparatus (electron beam drawing apparatus) which forms a pattern on a substrate by irradiating the substrate with a charged particle beam. In an electron beam drawing apparatus as another example of the lithography apparatus, an energy beam to be used is an electron beam, and elements which control an energy beam can include an electron gun, an electron lens, an aperture which forms an electron beam, and a deflector which controls a beam orbit. Referring to FIG. 3, the inside of a chamber (vacuum chamber) 21 is held in a vacuum. A lens barrel 22 holds an electron optical system. A shaping element 24 (including a collimator lens and an aperture array) shapes an electron beam exiting from an electron gun 23 as an electron (beam) source. An electron optical system 25 on the subsequent stage can include an electron lens, a blanking deflector, a blanking stop, and a scanning deflector.

In an electron beam drawing apparatus, carbon contamination adheres to the surfaces of an aperture for shaping an electron beam, a deflector which controls a beam orbit, an accelerating electrode, a magnetic field lens, and the like. When carbon contamination is deposited on these components forming the electron optical system, the following problems arise. First of all, when such contamination is deposited on the aperture for shaping an electron beam, it hinders the passage of a desired amount or shape of electron beam. When, for example, shaping an electron beam with a small diameter of about 20 nm, the aperture diameter is 20,000 nm (=0.02 mm) assuming that the electron lens focuses the electron beam to $\frac{1}{1000}$. When carbon is deposited on this opening to a thickness of 100 nm, the aperture opening area decreases by 2%. This decreases the passage of electron beam by 2%. As the passage amount of electron beam decreases, it is necessary to prolong the irradiation time for ensuring an irradiation amount necessary for a resist, resulting in a decrease in throughput.

In addition, although carbon is generally considered as a conductor, when carbon is deposited as contamination in the form of a carbon compound, the deposition exhibits the characteristics of an insulator. For this reason, applied charged particles or scattered electrons generated by them stay on the surface of the contamination deposition. As a result, the deposition is electrically charged. This phenomenon is called charge-up. For example, an aperture is generally formed from a conductor, the charge of an incident electron beam reliably escapes. However, as carbon is deposited on the aperture, charge stays on the surface. If the aperture has potential due to this charge, it influences the orbit of an applied electron beam. This leads to problems such as the inability to allow a necessary amount of electron beam to pass through the aperture.

As the controllability of an electron beam deteriorates, it is necessary to remove carbon contamination adhering to the surfaces of the aperture array 24 and electron optical system 25. The second embodiment will also exemplify a case of using hydrogen radicals. The following is a procedure for this operation. When performing drawing operation using an electron beam, the apparatus maintains the inside of the vacuum chamber 21 in a high vacuum of about $1 \times 10^{-6}$ Pa or less. A portion corresponding to the electron gun 23 may be closed with a gate valve (not shown) to maintain a high vacuum, as needed. In order to maintain a necessary pressure by introducing hydrogen gas, the exhaust capacity of an exhaust system 15 is decreased. A transport pipe 14 is inserted near a necessary portion in the lens barrel 22 from which contamination should be removed. The operator then starts to introduce hydrogen gas from an introduction port 13. The apparatus supplies a current to a filament 12 to generate hydrogen radicals. At this time, the inside of the lens barrel 22 is maintained at a pressure of about 5 Pa with hydrogen and hydrogen radicals. Although described in the first embodiment as well, the pressure at this time should be properly set within the range of 0.1 Pa to 100 Pa. Although the surface temperature of the filament 12 rises to about 1,700° C., since the chamber 11 is cooled by water (not shown) as in the prior art, the heat generated by the filament 12 does not influence the electron beam drawing apparatus through the transport pipe 14.

When almost all the carbon contamination on the aperture array 24 and the electron optical system 25 can be removed by supplied hydrogen radicals, the apparatus stops supplying a current to the filament 12 and then stops supplying hydrogen. The operator retracts the transport pipe 14 to a position where it does not interfere with the application of an electron beam, and sets the overall chamber (vacuum chamber) 21 in a high vacuum state by restoring the exhaust capacity of the exhaust system 15 to the initial capacity. When using an electron beam drawing apparatus, a large amount of residual hydrogen influences the apparatus. The apparatus waits until the pressure in the lens barrel 22 becomes $1 \times 10^{-5}$ Pa or less, and then resumes drawing. The active species to be used to remove carbon contamination is not limited to hydrogen radicals, and oxygen radicals, nitrogen radicals, plasma, or the like may be used.

Third Embodiment

Another example of the shape of the transport pipe will be described next. In the third embodiment, an infrared antireflection film is added onto the inner surface of the transport pipe which is indented. When processing the surface into the corrugated surface as described in the first embodiment, the top and bottom portions of each corrugation are inevitably curved more or less. Making each corrugation have an angle larger than that specified in the first embodiment to further reduce the surface area can form a smooth corrugated shape. With this shape, light reflected near the top portion of each corrugation passes through a transport pipe 14 without being reflected a plurality of number of times. In the third embodiment, an infrared antireflection film is formed on the corrugated surface. This can reduce the amount of light passing through due to reflection by the inner surface of the transport pipe 14. Of the light generated from a filament 12, infrared light has the great influences in terms of raising the temperature of a housing 10 or the like irradiated with the light passing through the transport pipe 14. For this reason, adding an infrared antireflection film for further reducing reflection of infrared light can obtain a higher effect.

As a material for an infrared antireflection film, carbon or a carbon compound is available. Silicon carbide, in particular, has high infrared absorbance and the property of making it difficult to deactivate active species, and hence is suitable as a material for an infrared antireflection film. In addition, many of metal oxides have higher absorption coefficients than metals themselves, and hence can attenuate infrared light even with a small number of times of reflection. As a film material which makes it difficult to deactivate radicals, like silicon carbide, it is possible to use silicon oxide, silicon nitride, or aluminum oxide.

Figure 5:
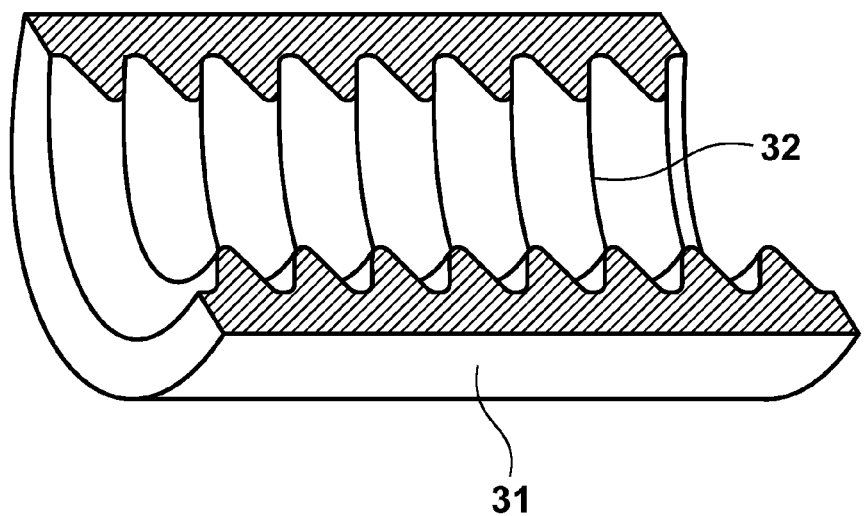
FIG. 5 is a view showing a half cut state of a transport pipe in the third embodiment.

FIG. 5 shows an example of a method of forming an infrared antireflection film on the corrugated inner surface of the elongated transport pipe 14, although it is difficult to add this film. As shown in FIG. 5, gutter-shaped members 31 obtained by splitting a transport pipe into two or more portions are prepared. After the these curved inner surfaces are processed into corrugated shapes 32, infrared antireflection films are formed on the surfaces. The two split gutter-shaped members 31 on which the infrared antireflection films are formed are manufactured and are joined face to face to form the transport pipe 14 having a cylindrical shape.

Fourth Embodiment

Figure 6:
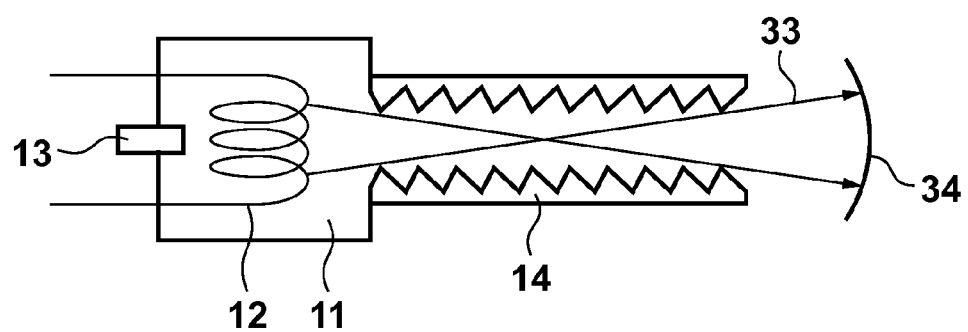
FIG. 6 is a view showing a supply apparatus in the fourth embodiment.
Figure 7:
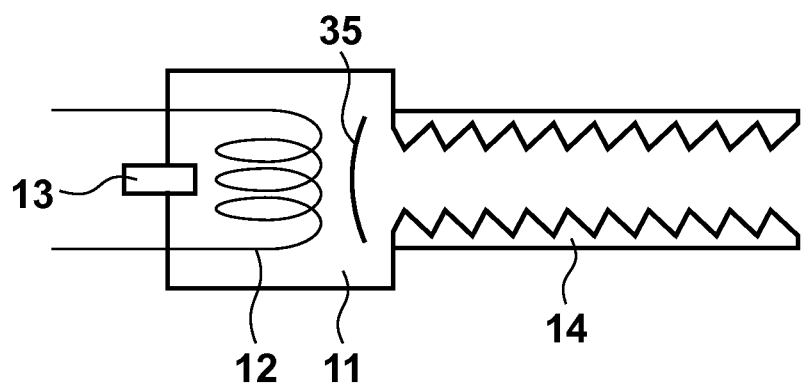
FIG. 7 is a view showing the supply apparatus in the fourth embodiment.

FIGS. 6 and 7 show other examples of the supply apparatus. When a chamber 11 is installed outside an exposure apparatus as in the first and second embodiments and the prior art, a transport pipe 14 sometimes becomes very long because it extends to a space accommodating optical elements. In this case, radicals may be deactivated in the transport pipe 14, and radicals of an amount sufficient for the removal of contamination may not reach the necessary space. In the fourth embodiment, therefore, a supply apparatus is installed in an exposure apparatus, and radicals are transported to the necessary space through the short transport pipe 14. To implement this arrangement, the supply apparatus is downsized as much as possible.

In the fourth embodiment, the size of the chamber 11 is reduced to downsize the supply apparatus, and a filament 12 is installed at the center of the chamber 11. Arranging the filament 12 in this manner will make a considerable proportion of the light emitted from the filament 12 reaches mirrors 7 to 9 without being reflected inside the transport pipe 14. For this reason, in the fourth embodiment, in order to prevent light from the filament 12 from reaching the mirrors 7 to 9, a shield member (or shield plate or shield) 34 for shielding against light is arranged near the outlet of the transport pipe 14, as shown in FIG. 6.

As shown in FIG. 7, a shield member 35 can be arranged between the filament 12 and one end of the transport pipe 14 on the inlet side. The arrangement shown in FIG. 7 can prevent light from the filament 12 from reaching the mirrors 7 to 9 and the like without corrugating the inner surface of the transport pipe 14. However, to prevent the deactivation of radicals generated in the chamber 11, there is also a demand for downsizing the shield member as much as possible. In addition, scattered light in the chamber 11 may enter the transport pipe 14. In consideration of them, a structure which makes it difficult for light to be reflected by the inner surface of the transport pipe 14 and pass through it increases the degree of freedom in design.

Fifth Embodiment

Still another example of the shape of the transport pipe will be described. In order to form a corrugated shape on a transport pipe and make it reflect infrared components especially regarded to have great influences, a metal film such as an aluminum film, which has high reflectance, can be used for the surface of the transport pipe. On the other hand, active species such as hydrogen radicals tend to be deactivated when they come into contact with the surface of a structure. It has been reported that different materials for the surface of a structure differ in the degree of deactivation. Active species are not easily deactivated on the surface of an oxide as compared with a metal surface. Quartz ($SiO_2$) is especially regarded as a material which does not easily cause deactivation. Therefore, the inner surface of a transport pipe 14 can be formed by using quartz.

Figure 8:
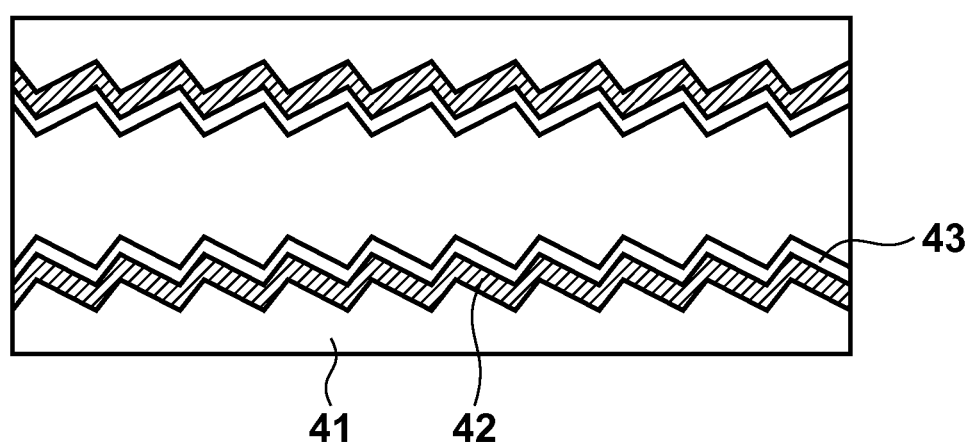
FIG. 8 is a sectional view of a transport pipe in the fifth embodiment.

The fifth embodiment pays attention to this point, and forms the inner surface of the transport pipe 14 by using a corrugated metal reflecting surface, and a quartz layer is formed on the metal reflecting surface. FIG. 8 is a sectional view of the transport pipe 14 in the fifth embodiment. As shown in FIG. 8, in the transport pipe 14, an infrared antireflection layer 42 made of a thin aluminum film is formed on a transport pipe housing 41, and a quartz layer 43 is formed on the infrared antireflection layer 42. With this arrangement, the infrared light generated from the filament 12 and entering the transport pipe 14 is transmitted through the quartz layer and reflected by the infrared antireflection layer. At this time, the intensity of the infrared light is greatly attenuated. In addition, with regard to the transportation of radicals through the transport pipe 14, which is the purpose of the transport pipe 14, covering the inner surface of the transport pipe 14, with which radicals come into contact, with a quartz film can minimize the deactivation of radicals on the inner surface of the transport pipe. Note that the infrared antireflection layer 42 made of a thin aluminum film in the fifth embodiment may be replaced with an infrared absorbing material layer, and a quartz layer may be formed on the infrared absorbing material layer.

[Method of Manufacturing Article]

A method of manufacturing an article according to an embodiment of the present invention is suitable for manufacturing an article such as a microdevice such as a semiconductor device or an element having a microstructure. This manufacturing method can include the step of forming a pattern on a photosensitizing agent applied on a substrate coated with the photosensitizing agent by using the lithography apparatus (the step of forming a pattern on a substrate) and the step of processing (for example, developing) the substrate on which the pattern has been formed in the preceding step. In addition to or following the forming step, the manufacturing method can further include other known steps (oxidation, film formation, deposition, doping, planarization, etching, resist removal, dicing, bonding, packaging, and the like). The method of manufacturing an article according to this embodiment is superior to the conventional method in at least one of the performance of an article, quality, productivity, and production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-233305, filed Oct. 22, 2012, which is hereby incorporated by reference herein in its entirety.

What is claimed is:

1. A supply apparatus for supplying radicals, the apparatus comprising:
a generator arranged in a chamber and configured to generate radicals by activating a gas supplied into the chamber; and
a transport pipe having one end connected to the chamber and the other end from which the generated radicals are discharged, wherein
the generator is configured to activate the gas with infrared light radiation accompanied, and
an inner surface of the transport pipe is formed into a patterned shape by which the infrared light exiting the other end is less than the infrared light entering the one end.

2. The apparatus according to claim 1, wherein in a cross section, of the transport pipe, including an axis of the transport pipe which extends from the one end to the other end, the inner surface includes iterations of a first line segment and a second line segment which are connected to each other and inclined opposite to each other with respect to the axis, and an inclination angle of the first line segment relative to the axis is different from an inclination angle of the second line segment relative to the axis.

3. The apparatus according to claim 1, further comprising a shield configured to shield the infrared light emitted from the generator, on a straight line connecting the generator and a target to which the radicals are supplied.

4. The apparatus according to claim 3, wherein the shield includes a part of a wall of the chamber.

5. The apparatus according to claim 3, wherein the shield is arranged between the generator and the one end of the transport pipe.

6. The apparatus according to claim 1, further comprising a shield configured to shield the infrared light exiting the other end of the transport pipe.

7. The apparatus according to claim 1, wherein an antireflection film for the infrared light is formed on the inner surface of the transport pipe.

8. The apparatus according to claim 7, wherein the antireflection film contains material selected form the group consisting of carbon, a carbon compound, and a metal oxide.

9. The apparatus according to claim 1, wherein a film made of material selected form the group consisting of silicon oxide, silicon carbide, silicon nitride, and aluminum oxide is formed on the inner surface of the transport pipe.

* * * * *